(12) United States Patent
Schmierer et al.

(10) Patent No.: US 7,646,272 B1
(45) Date of Patent: Jan. 12, 2010

(54) FREELY ORIENTED PORTABLE SUPERCONDUCTING MAGNET

(75) Inventors: Eric N. Schmierer, Los Alamos, NM (US); F. Coyne Prenger, Los Alamos, NM (US); Dallas D. Hill, Los Alamos, NM (US)

(73) Assignee: The United States of America as represented by the United States Department of Energy, Washington, DC (US)

( * ) Notice: Subject to any disclaimer, the term of this patent is extended or adjusted under 35 U.S.C. 154(b) by 116 days.

(21) Appl. No.: 11/832,669

(22) Filed: Oct. 12, 2007

(51) Int. Cl.
*H01F 1/00* (2006.01)
*H01F 6/00* (2006.01)
*H01F 7/00* (2006.01)
*H01F 5/00* (2006.01)

(52) U.S. Cl. .................. 335/216; 335/300; 335/301; 505/885

(58) Field of Classification Search .......... 505/875, 505/885; 335/216, 300, 301
See application file for complete search history.

(56) References Cited

U.S. PATENT DOCUMENTS

| | | | |
|---|---|---|---|
| 3,986,341 A * | 10/1976 | DeHaan | 62/50.7 |
| 4,048,437 A | 9/1977 | Vander Arend et al. | |
| 4,066,991 A * | 1/1978 | Marston et al. | 335/216 |
| 4,516,405 A * | 5/1985 | Laskaris | 62/50.7 |
| 4,692,560 A | 9/1987 | Hotta et al. | |
| 4,721,934 A * | 1/1988 | Stacy | 335/300 |
| 4,726,199 A * | 2/1988 | Takano et al. | 62/505 |
| 4,848,103 A * | 7/1989 | Pelc et al. | 62/51.1 |
| 4,895,831 A * | 1/1990 | Laskaris | 505/163 |
| 5,317,879 A | 6/1994 | Goldberg et al. | |
| 5,343,180 A * | 8/1994 | Fukumoto et al. | 335/216 |
| 5,402,648 A | 4/1995 | Longsworth | |
| 5,442,928 A | 8/1995 | Laskaris et al. | |
| 5,446,433 A | 8/1995 | Laskaris et al. | |
| 5,461,873 A | 10/1995 | Longsworth | |
| 5,485,730 A | 1/1996 | Herd | |
| 5,495,718 A | 3/1996 | Pierce et al. | |
| 5,739,689 A * | 4/1998 | Roth et al. | 324/320 |
| 5,848,532 A | 12/1998 | Gamble et al. | |
| 6,011,454 A | 1/2000 | Huang et al. | |
| 6,078,234 A | 6/2000 | Huang et al. | |
| 6,107,905 A | 8/2000 | Itoh et al. | |
| 6,313,556 B1 * | 11/2001 | Dombrovski et al. | 310/91 |
| 6,622,494 B1 * | 9/2003 | Pourrahimi | 62/51.1 |
| 7,012,347 B2 * | 3/2006 | Kwon et al. | 310/64 |
| 7,030,613 B2 * | 4/2006 | Morita et al. | 324/318 |
| 2004/0017117 A1 * | 1/2004 | Kwon et al. | 310/61 |
| 2005/0068034 A1 * | 3/2005 | Morita et al. | 324/322 |
| 2005/0262851 A1 * | 12/2005 | Atrey | 62/6 |
| 2006/0038567 A1 * | 2/2006 | Morita et al. | 324/318 |

* cited by examiner

*Primary Examiner*—Elvin G Enad
*Assistant Examiner*—Alexander Talpalatskiy
(74) *Attorney, Agent, or Firm*—Thomas S. O'Dwyer; James C. Durkis; Paul A. Gottlieb

(57) ABSTRACT

A freely oriented portable superconducting magnet is disclosed. Coolant is supplied to the superconducting magnet from a repository separate from the magnet, enabling portability of the magnet. A plurality of support assemblies structurally anchor and thermally isolate the magnet within a thermal shield. A plurality of support assemblies structurally anchor and thermally isolate the thermal shield within a vacuum vessel. The support assemblies restrain movement of the magnet resulting from energizing and cooldown, as well as from changes in orientation, enabling the magnet to be freely orientable.

19 Claims, 19 Drawing Sheets

FREELY ORIENTED PORTABLE SUPERCONDUCTING MAGNET

STATEMENT REGARDING FEDERALLY SPONSORED RESEARCH OR DEVELOPMENT

The United States Government has rights in this invention pursuant to Contract No. DE-AC52-06NA25396 between the U.S. Department of Energy National Nuclear Security Administration and the Los Alamos National Security LLC for the operation of the Los Alamos National Laboratory.

CROSS-REFERENCE TO RELATED APPLICATIONS

Not Applicable

REFERENCE TO A "SEQUENCE LISTING", A TABLE, OR A COMPUTER PROGRAM LISTING APPENDIX SUBMITTED ON COMPACT DISC AND AN INCORPORATION-BY-REFERENCE OF THE MATERIAL ON THE COMPACT DISC

Not Applicable

BACKGROUND OF THE INVENTION

1) Field of the Invention The present invention relates generally to a superconducting magnet apparatus, and particularly to a superconducting magnet apparatus that is freely orientable and portable.

2) Background of the Need

For many current superconducting magnet applications, weight is typically not a major design criterion because they do not need to be mobile. Existing superconducting magnet systems often have the liquid cryogens (and storage means) as an integral part of the magnet cryostat. Systems that have the cryogens stored separately from the magnets are typically stationary and may not allow free orientation of the magnet with respect to gravity.

As superconducting materials mature, (e.g. higher temperature operation and current density, smaller size), their weight and cost will decrease thereby opening up new or expansion of existing opportunities. A light-weight, portable magnet ("field deployable") that could be oriented in any direction could have applications for temporary deployment of military or civilian medical facilities for use with MRI or NMR machines. For example, such field-deployed MRI or NMR machines could be used at the scene of accidents or in homes where a patient is not movable. A concern with current MRI machines is the claustrophobic effect where some patients simply can't endure the procedure without sedation. Children become terrified and are inconsolable by parents. There is a need for an open framed MRI machine. Multiple (flowed cryogens) coils could allow for an open frame MRI configuration. The open frame alleviates claustrophobia, permits contact with the patient, and permits diversions such as television or movies. A freely orientable high-field magnet with separate cryogens would allow cranes, specialized laboratory lifting devices, and machining chucks to connect (magnetic coupling) to metal objects. A freely orientable portable magnet could be moved to and provide an external magnetic field to magnetize various ferretic objects. Two opposing magnets could be coupled together to produce lifting devices for large objects in emergencies or specialized industrial applications. There is a need for a superconducting high field magnet that can be operated in any orientation relative to gravity, and is portable (preferably operable and each subassembly transportable by one person due to its low weight and size).

3) Description of Related Art Including Information Disclosed Under 37 CFR 1.97 and 37 CFR 1.98

Superconducting magnets require cooling systems to maintain the conductors at superconducting temperatures. Cooling may occur via one or more methods: thermal conduction, radiation or convection. Systems that utilize coolant for convection cooling generally fall into two categories. One category provides for immersing the conductors in a pool of coolant. This mode of cooling limits orientation of the magnet. The second category provides for circulating coolant through or in channels near the conductors. The coolant may be single phase (gaseous utilizing sensible heat) or two phase (utilizing latent and sensible heat).

U.S. Pat. No. 4,048,437 discloses cooling superconducting magnets via circulating coolant in conduits in which the conductors are disposed. U.S. Pat. No. 4,692,560 discloses a superconducting coil apparatus wherein the superconducting wires are cooled via coolant flowing through the conduit in which the wires are disposed. U.S. Pat. No. 5,317,879 discloses using cables to cool superconducting magnets via thermal conduction. U.S. Pat. No. 5,402,648 discloses a system for cooling superconducting magnets via circulating coolant from a dewar. U.S. Pat. No. 5,442,928 discloses cooling superconducting magnets by circulating liquid helium. U.S. Pat. No. 5,461,873 discloses natural convection cooling of a superconducting magnet by circulating helium gas. U.S. Pat. No. 5,485,730 discloses cooling superconducting magnets via circulating coolant from a remotely located cryocooler. U.S. Pat. No. 5,495,718 discloses cooling superconducting magnets via circulating coolant from a closed dewar. U.S. Pat. No. 5,848,532 discloses cooling superconducting magnets via circulating coolant remotely from a remote cryocooler. U.S. Pat. No. 6,107,905 discloses a superconducting magnet apparatus wherein cooling occurs utilizing the latent heat of vaporization of liquid helium.

Superconducting magnet apparatus require support structures to prevent movement of the conductors that may create friction causing quenching of the superconducting state.

U.S. Pat. No. 5,446,433 discloses a support structure for a superconducting magnet which is resistant to shock and vibration forces. U.S. Pat. No. 6,078,234 discloses structural members to resist forces generated within and between pairs of superconducting magnetic assemblies. U.S. Pat. No. 6,011,454 discloses a suspension system, comprising frustro-conical surfaces, for a superconducting magnet assembly.

BRIEF SUMMARY OF THE INVENTION

In the present invention, the magnet is a solenoid preferably of rectangular or circular cross-section to allow the most compact insulation and vacuum vessel. The magnet coil is shaped as a toroid providing a warm (ambient air temperature) bore open section enabling objects to be passed through as in an MRI. The magnet may have circular, elliptical, rectangular, square or other polygonal cross-section shape. The magnet is disposed on a bobbin assembly (together hereinafter referred to as magnet/bobbin subassembly) either by winding directly on the bobbin or attachment post winding of the coil. Inner support assemblies (in at least three locations, preferably generally equally spaced circumferentially) support (thermally isolate) and anchor (restrain movement) the magnet/bobbin subassembly within a thermal shield with a toroidal or other cross-sectional shape. In preferred embodiments, a bobbin bridge (shown as two half sections) is interposed between each inner support assembly and the magnet/bobbin subassembly to improve thermal isolation. The inner support assemblies include a plurality of restraint members (straps, rods/links, beams or combination of the foregoing), which provide structural connections and thermal isolation between the magnet/bobbin subassembly and support ring portions of the inner support assemblies. Outer support assemblies (in at least three locations, preferably generally equally spaced circumferentially) support (thermally isolate) and anchor (restrain movement) the thermal shield within a toroid shaped vacuum vessel. In preferred embodiments, a thermal shield bridge (shown as two half sections) is interposed between each outer support assembly and the thermal shield to improve thermal isolation. The outer support assemblies include a plurality of restraint members (straps, rods/links, beams, or combination of the foregoing), which provide structural connections and thermal isolation between the thermal shield and support ring portions of the outer support assemblies. Bobbin and thermal shield bridges may also be used to provide appropriate surfaces for strap restraint members to bear against. With this configuration, movement of the magnet/bobbin subassembly in all directions, heat leaks and size of components are thereby minimized. In other embodiments, the actively cooled thermal shield is absent, in which case the magnet/bobbin subassembly is anchored/supported directly within the vacuum vessel.

"Straps" refer to restraint members that provide tensile resistance, "Rods/links" refer to restraint members that provide compressive and tensile resistance. Rods/links would be pinned or threaded connections that provide some moment (bending) resistance. "Beams" refer to restraint members that provide tensile, compressive, torsion and bending resistance. In any orientation, the restraint members restrain movement of the magnet due to energizing and cooldown and react the magnet weight and magnetic forces induced during operation, while providing the most compact magnet, thermal shield, and vacuum vessel arrangement for weight minimization. Restraint members would preferably be comprised of materials with low thermal conductivity, and high strength. Since straps require a certain degree of flexibility to install, a fiber/polymer composite is preferred. Thin stainless steel or titanium straps could also be used where there may be an insulating material between them and the magnet/bobbin subassembly or the thermal shield, such as the bridges described previously. With respect to rods/links and beams, hollow titanium rods may be used, and hollow stainless steel if the higher thermal losses can be tolerated, or bridges used (as previously described). Composites (polymers strengthened with high tensile strength fibers) are preferred due to their low thermal conductivity. In a preferred embodiment using beams, G10 composite (glass fiber reinforced epoxy) beams are used. Bobbin and thermal shield bridges would preferably be comprised of machinable, composite material(s) with low thermal conductivity, low permeability, and low density such as nylon or G10.

Coolant is stored in one or more repositories (e.g. closed dewars) separate from the magnet, reducing the weight of the magnet assembly. In the context of this invention, the terms "cryogen" and "coolant" are to be understood as being interchangeable. To overcome the limitation on orientation in the prior art where the magnet is immersed in a bath, in the present invention coolant is circulated from the repository(s) to (and from) the magnet in one or more (preferably flexible) transfer lines allowing the magnet to be oriented in any direction. In a preferred embodiment, the transfer line has a concentric tube design wherein liquid flows in the inner tube and vapor returns in the outer tube enabling intercept of heat leaks. In other embodiments, separate lines are used for supply and return of the coolant. Vapor is vented away from the magnet assembly, preferably nearer to the repository(s). Pumping force for the cryogen results from one or more pumps, or preferably vapor generated pressurization to minimize weight. Cooling is provided to the magnet via flow of coolant in fluid channels, tubing thermally connected with the magnet/bobbin subassembly, or a combination of the foregoing. In certain embodiments, cooling is provided to the thermal shield via flow of coolant in fluid channels, tubing thermally connected with the thermal shield, or a combination of the foregoing. In certain embodiments, cooling is provided to the current leads. In certain embodiments, multiple coolants are used. Coolant supplied to bobbin may be supplied in a single path coiled around the bobbin, or in parallel paths around the bobbin. Similarly, coolant supplied to the thermal shield may be a single coiled path or in parallel paths.

In one embodiment, liquid nitrogen is supplied to a thermal shield surrounding the magnet, while liquid helium is supplied to the magnet/bobbin subassembly. Thermal energy conducted from the magnet/bobbin subassembly vaporizes the helium which is vented. Effluent vapor is used to cool the current leads as well. In another embodiment, only helium is used as the coolant. Liquid helium is supplied to the magnet/bobbin subassembly, and thermal energy conducted from the magnet/bobbin subassembly vaporizes the helium. Vaporized helium is circulated through the thermal shield surrounding the magnet/bobbin subassembly prior to being vented. In another embodiment, wherein the actively cooled thermal shield is absent, liquid helium cools the magnet/bobbin subassembly and the vaporized helium is vented. Although less preferred, it is to be understood that the present invention also encompasses embodiments wherein the coolant vapor is retained and re-liquefied. It is to be understood that the use of nitrogen and helium is exemplary and that the choice of coolant depends on the temperature threshold requirement for the specific superconducting magnet material. Persons with ordinary skill in the art would be able to specify the appropriate coolant(s) for specific applications.

In the present invention, the magnet is wound so as to make it a rigid body (such as through the use of epoxy bonding). This precludes problems associated with quenching due to movement of wires during energizing and damage due to thermal shock during cooldown. The design allows for a quick cooldown (using liquid helium). When the magnet cools it contracts more than the thermal shield which in turn contracts more than the vacuum vessel. This tightens the concentric straps, providing better stiffness when the magnet is energized. The coolant is forced through a channel (or tube) that is structurally connected to the magnet to minimize thermal resistance. Two-phase flow of the liquid coolant presents a constant temperature to the magnet around its circumference with passage of the coolant. This is beneficial from a thermal stress point of view, as well as providing thermal capacity for cooling of hot spots. Temperature gradients across the magnet could cause undesirable thermal stresses and quenching.

In the present invention, bayonets or permanent transfer line connections, power lead feed throughs, vents and other interconnecting coolant plumbing in the vacuum space are housed in a vacuum bulkhead. The vacuum bulkhead may interface with the vacuum vessel toroid in a method that facilitates assembly and coolant tubing connections and is structurally sound due to external pressure and provides for a compact assembly depending on the application.

BRIEF DESCRIPTION OF THE SEVERAL VIEWS OF THE DRAWING

FIGS. 6A-6F illustrate aspects of the invention with respect to components comprising an outer support assembly (OSA).

DETAILED DESCRIPTION OF THE INVENTION

Figure 1:
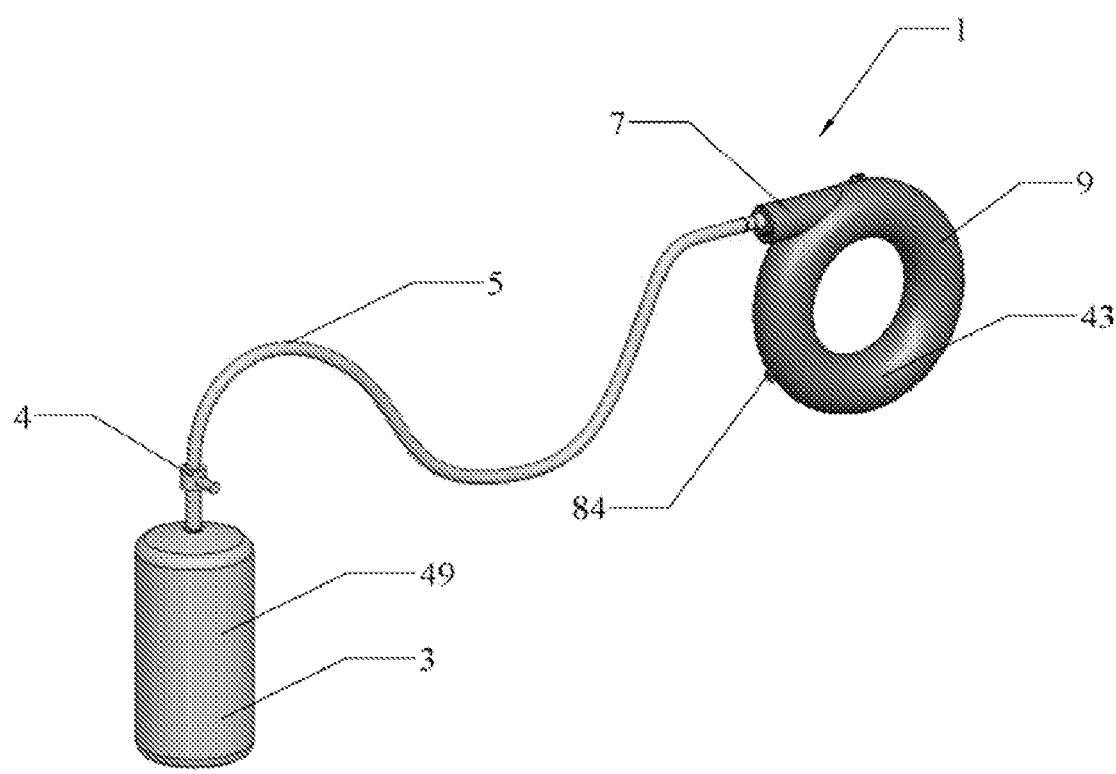
FIG. 1 illustrates a basic configuration of the present invention 1. In the figures, like or similar elements (such as vacuum vessel 9) utilize the same reference characters throughout the various views.

A basic embodiment of the present invention is described hereunder with reference to FIG. 1. A single coolant 49 stored in dewar 3 is transported to/from a vacuum vessel 9 to cool a superconducting magnet 43 which is anchored/supported within vacuum vessel 9. Coolant and electrical connections are made via vacuum vessel bulkhead 7. Coolant 49 is transported through transfer line 5 to vacuum vessel 9 as saturated liquid, and preferably returns in vapor (gaseous) form, preferably vented via vapor vent 4. In a further embodiment, a plurality of support points 84 provide anchoring points for positioning and/or storage hardware.

Figure 2:
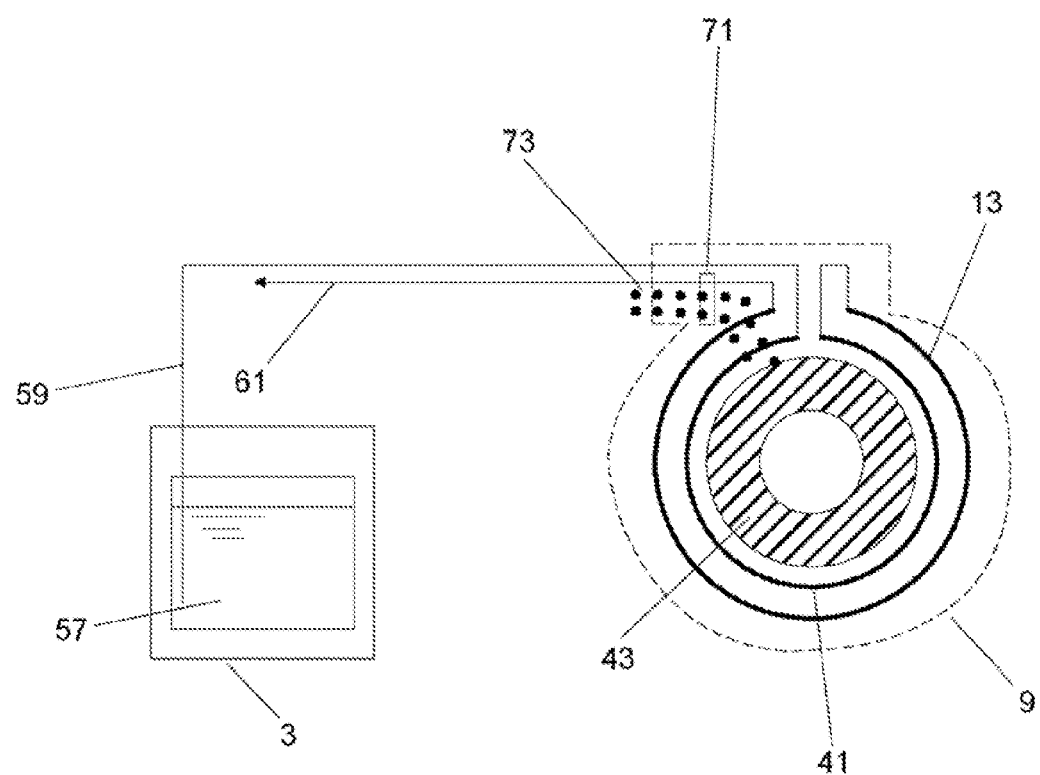
FIG. 2 illustrates an embodiment of the invention wherein a single coolant is supplied to the magnet/bobbin subassembly, and subsequently supplied to the thermal shield.

Referring to FIG. 2, coolant 57 (e.g. helium) contained in dewar 3 is transported via transfer line 59 to bobbin 41 which is in thermal contact with superconducting magnet 43. Coolant 57 flows to and actively cools thermal shield 13, and then exits vacuum vessel 9 via transfer line 61 (preferably primarily as vapor). Current leads 73 are cooled by coolant 57 via heat conduction path 71.

Figure 3:
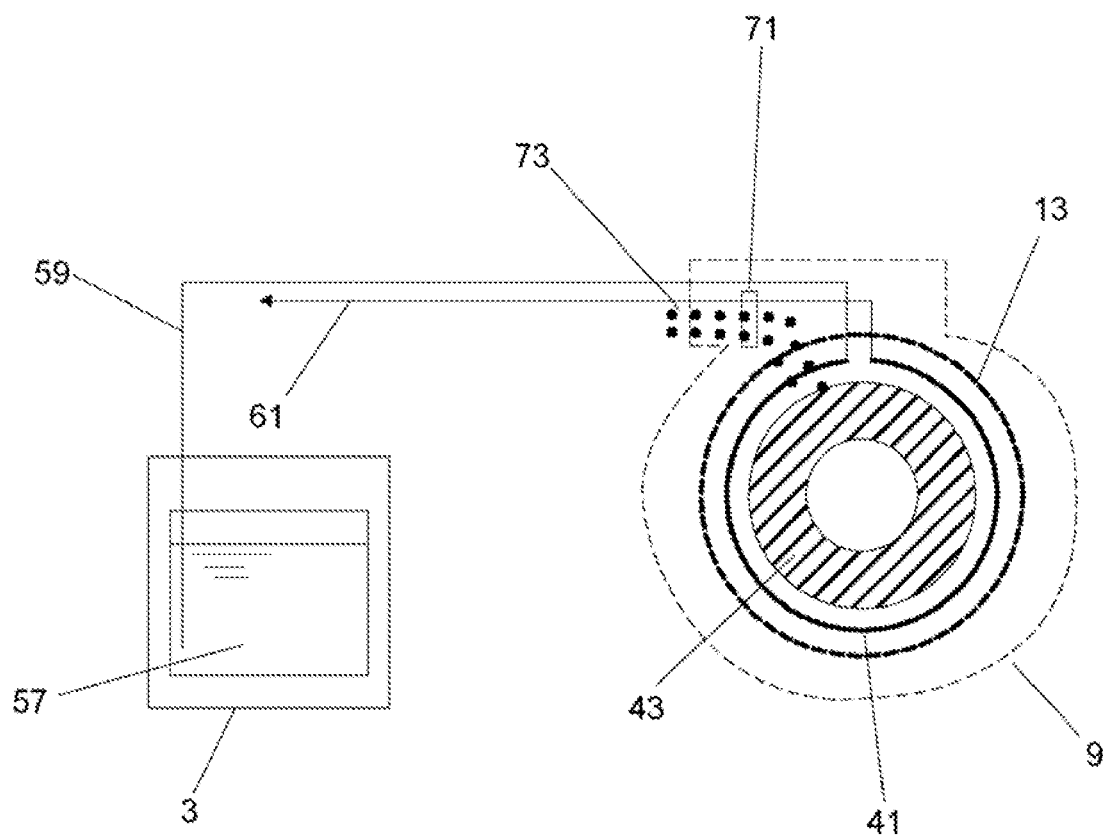
FIG. 3 illustrates an embodiment of the invention wherein coolant is supplied to the magnet/bobbin subassembly and does not have an actively cooled thermal shield.

Referring to FIG. 3, coolant 57 (e.g. helium) contained in dewar 3 is transported via transfer line 59 to bobbin 41 which is in thermal contact with superconducting magnet 43. Coolant 57 exits passively cooled thermal shield 13, and then exits vacuum vessel 9 via transfer line 61 (preferably primarily as vapor). Current leads 73 are cooled by coolant 57 via heat conduction path 71.

Figure 4:
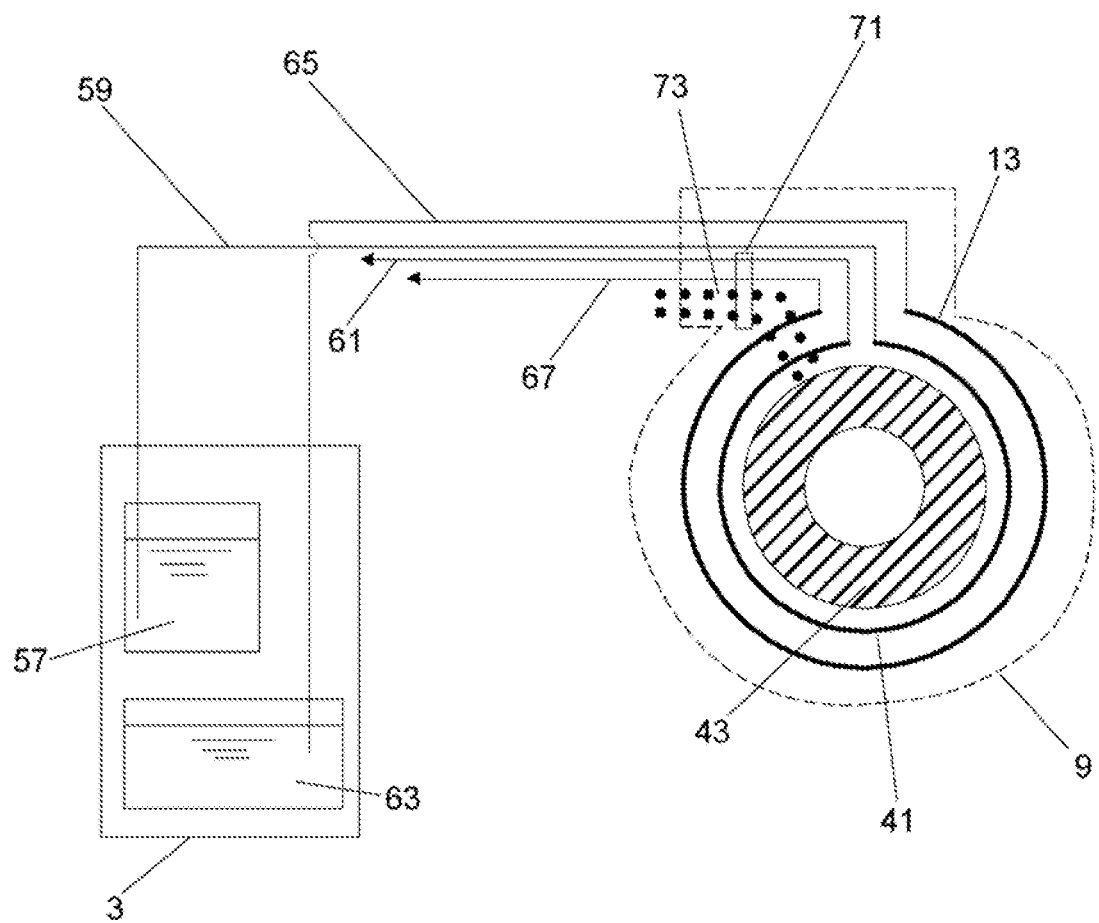
FIG. 4 illustrates an embodiment of the invention wherein one coolant is supplied to the thermal shield, and a second coolant is supplied to the magnet/bobbin subassembly.

Referring to FIG. 4, dewar 3 contains coolant 57 (e.g. helium) and coolant 63 (e.g. nitrogen). Coolant 57 is transported via transfer line 59 to bobbin 41 which is in thermal contact with superconducting magnet 43. Coolant 57 is subsequently vented via return transfer line 61. Coolant 63 is transported via transfer line 65 to thermal shield 13 and then exits vacuum vessel 9 via transfer line 67 (preferably primarily as vapor). Current leads 73 are cooled by coolants 57 and 63 via heat conduction path 71. In other embodiments, the current leads are cooled by a single coolant only.

Figure 5A:
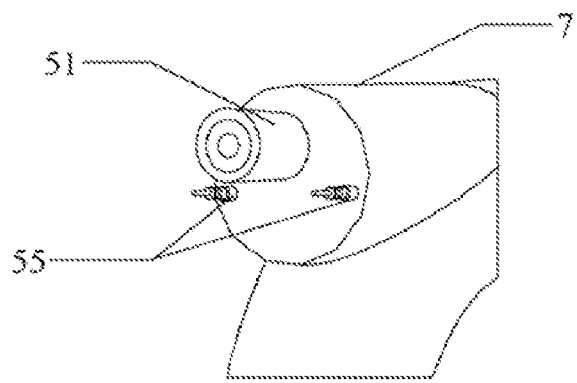
FIG. 5A illustrates an embodiment of the invention wherein coolant is provided through a single coaxial penetration.
Figure 5B:
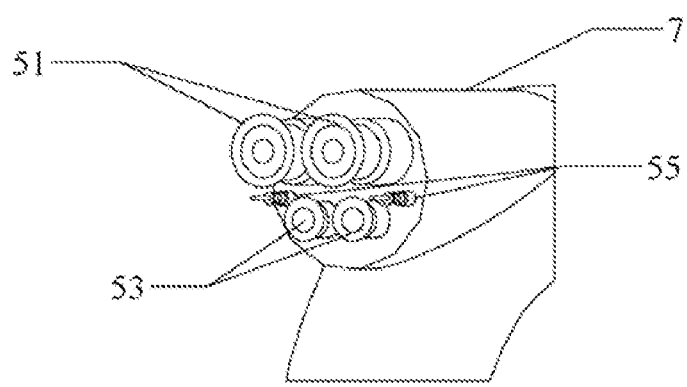
FIG. 5B illustrates an embodiment of the invention wherein coolants are provided via separate inlet and outlet penetrations.

FIG. 5A illustrates a single coolant embodiment with a coaxial coolant feedthru (exemplified by helium bayonet 51) and hermetic electrical feedthrus 55 in vacuum vessel bulkhead 7. FIG. 5B illustrates a two coolant embodiment with coolant feedthrus (exemplified by supply/return helium bayonets 51 and supply/return nitrogen bayonets 53) and hermetic electrical feedthrus 55 in vacuum vessel bulkhead 7. Preferred materials for thermal shield 13, vacuum vessel bulkhead 7, and vacuum vessel 9 would be those having lightweight, high strength, high thermal conductivity and relative permeability of 1 (to preclude interference with the magnetic field). Aluminum would be preferred over copper where weight is an issue, and preferred over titanium if cost is an issue. It is to be understood that references to various elemental metals represent their alloys and material conditions (e.g. heat treatment) as well.

Figure 6A:
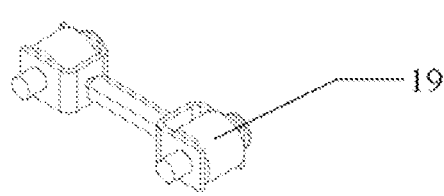
Figure 6B:
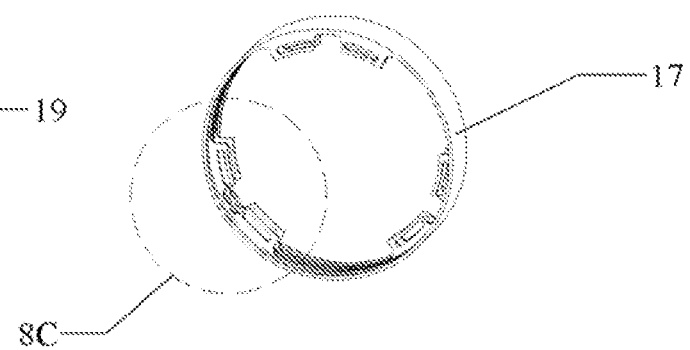
Figure 6C:
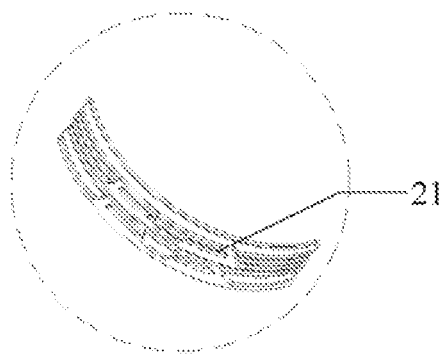
Figure 6D:
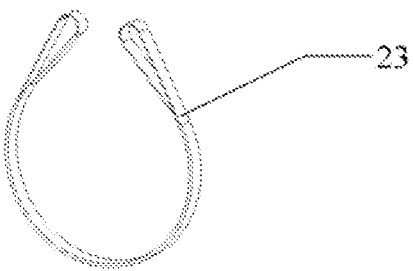
Figure 6E:
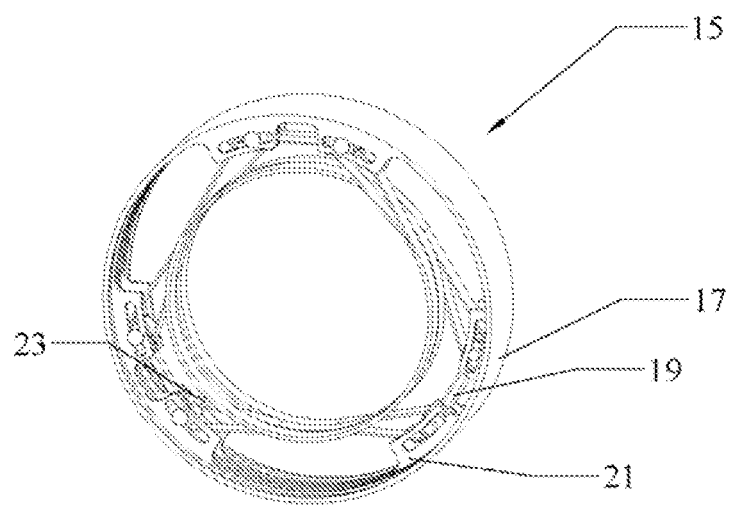

FIGS. 6A to 6E illustrate components of an embodiment of outer support assembly 15 utilizing strap restraint members. Referring to FIG. 6E, a plurality (at least three) of straps 23 (FIG. 6D) are spaced generally equally around the circumference of the support ring 17. The two ends of each strap 23 are anchored to support ring 17 (FIG. 6B) by tension assembly 19 (FIG. 6A) at support ring section 21 (FIG. 6C). Preferred materials for support ring 17 and tension assembly 19 would be those having lightweight, high thermal conductivity and relative permeability of 1 (to preclude interference with the magnetic field). Aluminum would be preferred over copper where weight is an issue, and preferred over titanium if cost is an issue.

Figure 7A:
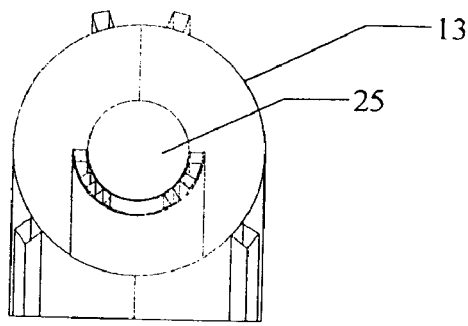
FIGS. 7A-7D illustrate aspects of the invention with respect to the magnet, bobbin subassembly, outer support assemblies, vacuum vessel, and the thermal shield.
Figure 7B:
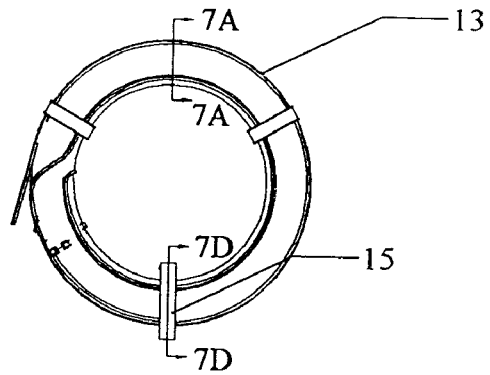
Figure 7C:
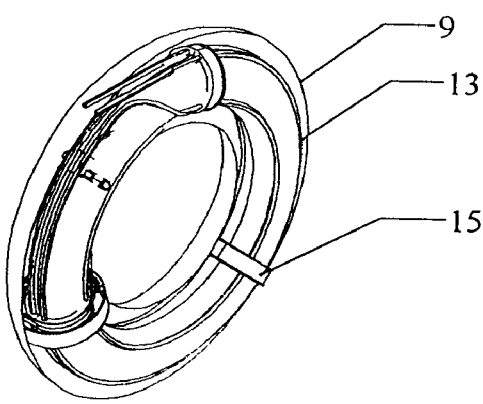
Figure 7D:
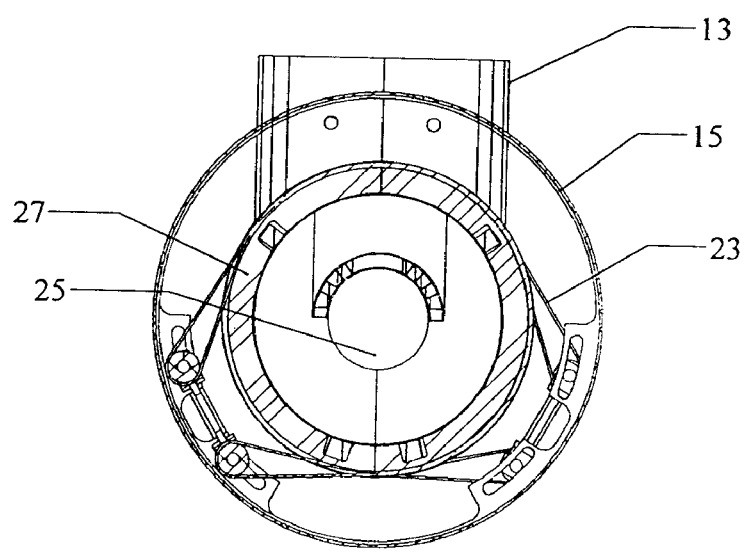

FIGS. 7A to 7D further illustrate orientation of the plurality (three shown) of outer support assemblies (OSAs) 15 (utilizing straps 23) with respect to vacuum vessel 9, thermal shield 13, and magnet/bobbin subassembly 25 located within thermal shield 13. FIG. 7B presents a side view of thermal shield 13 and plurality of outer support assemblies 15. FIG. 7A presents a cross-section view of the thermal shield taken at a point away from an outer support assembly 15. FIG. 7C presents a cutaway perspective view of vacuum vessel 9 with vacuum vessel bulkhead 7 removed for clarity; thermal shield 13 is anchored and supported within vacuum vessel 9 by a plurality (at least three) of outer support assemblies 15. The outer support assemblies 15 thermally isolate and minimize physical movement of the thermal shield 13 within vacuum vessel 9. Outer support assemblies 15 may be secured to vacuum vessel 9 by means well known to those skilled in the art, including but not limited to, welding and mechanical fastening. FIG. 7D presents a cross-section view of the thermal shield at the location of an outer support assembly 15. FIG. 7D also illustrates the presence of thermal shield bridge 27 (FIG. 11A) disposed between thermal shield 13 and straps 23 to provide thermal isolation of thermal shield 13 from vacuum vessel 9 (not shown). Straps 23 (two shown) are concentric with thermal shield bridge 27 and thermal shield 13. The straps keep the thermal shield concentric with vacuum vessel 9 with respect to hoop cross-section (FIG. 17A) and with respect to the major bore axis of the vacuum vessel 9 (FIG. 17B). The location of the OSAs to ISAs with respect to each other depends on the application and forces involved.

Figure 8A:
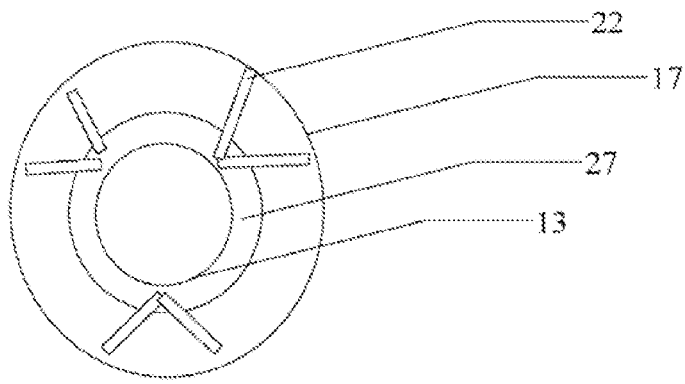
FIGS. 8A-8C illustrate embodiments of the invention wherein rods/links, or beam restraint members anchor/support the thermal shield within the vacuum vessel.
Figure 8B:
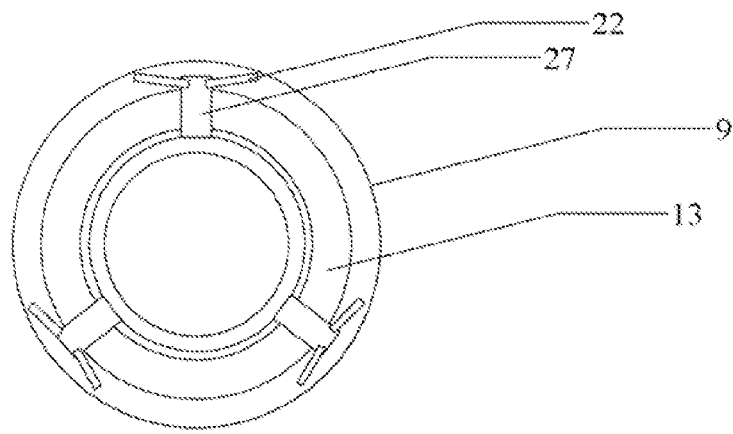
Figure 8C:
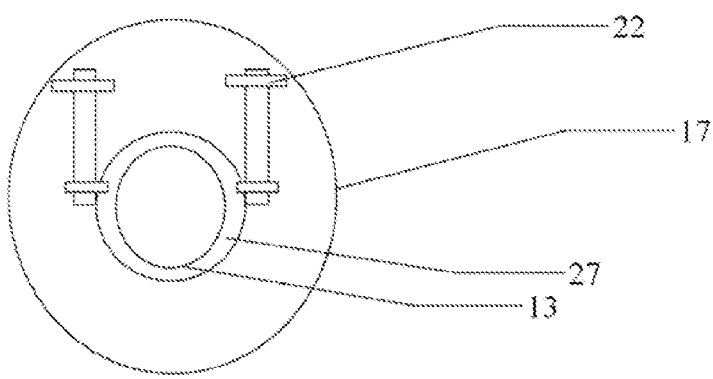

FIGS. 8A to 8C illustrate embodiments wherein rods/links (FIGS. 8A, 8B) or beams (FIG. 8C) are used to anchor/support thermal shield 13 to vacuum vessel 9. FIG. 8A (end view) illustrates a plurality of rods/links restraint members 22 emanating radially, that anchor/support thermal shield 13 to vacuum vessel 9 via attachment to thermal shield bridge 27. FIG. 8B (side view) illustrates how the plurality of rods/links restraint members 22 emanate azimuthally, to anchor/support thermal shield 13 to vacuum vessel 9 via attachment to thermal shield bridge 27. FIG. 8C (end view) illustrates a plurality of beam restraint members 22 emanating radially, that anchor/support thermal shield 13 to vacuum vessel 9 via attachment to thermal shield bridge 27. It should be understood that the beam restraint members 22 also emanate azimuthally (not shown), analogous to the rods/links shown in FIG. 8B.

Figure 9A:
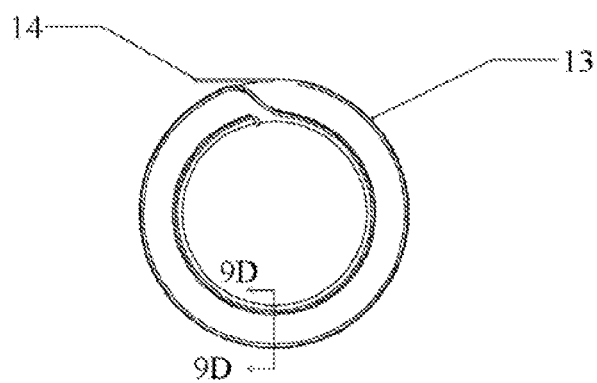
FIGS. 9A-9E illustrate aspects of the invention with respect to thermal shield coolant paths.
Figure 9B:
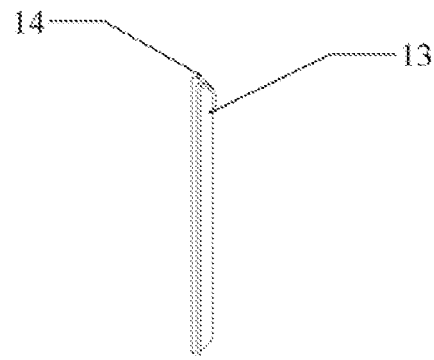
Figure 9C:
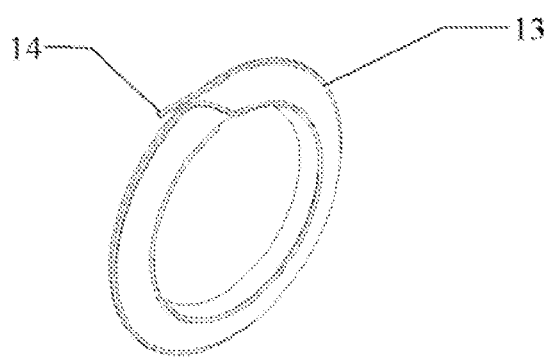
Figure 9D:
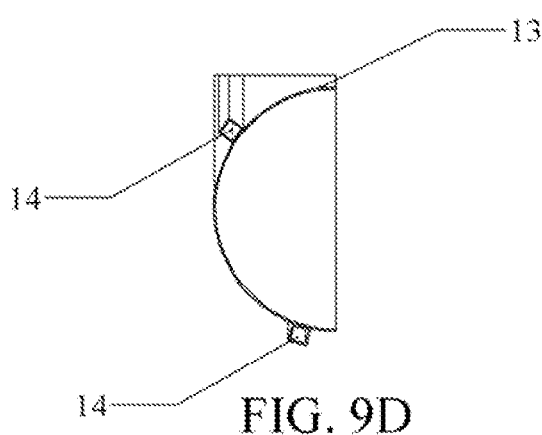
Figure 9E:
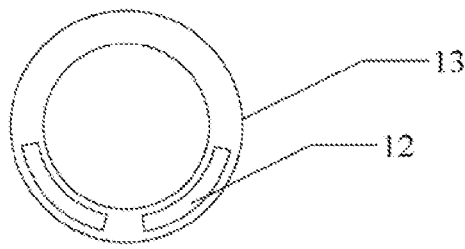

FIGS. 9A to 9D illustrate an embodiment of the thermal shield 13 comprising toroid half shells, having coolant tubing 14 attached. FIGS. 9A, 9B and 9C present a side cutaway view, end view, and perspective view, respectively, of thermal shield 13 and coolant tubing 14. FIG. 9D presents a cross-section view illustrating coolant tubing 14 that begin and end at appropriate points and methods to access the vacuum bulkhead 7. In preferred embodiments, the tubing is square or rectangular in cross-section to maximize thermal contact with the thermal shield surfaces. Other shapes such as circular, elliptical, or other polygons may be useful as a particular situation dictates. Preferred materials for the tubing would be those with high thermal conductivity, such as copper or aluminum. Attachment methods include brazing (for copper), welding (for aluminum), and mechanical fastening using indium as a gasket material. FIG. 9E presents a cross-section view for an embodiment with thermal shield 13 having coolant channels 12.

Figure 10A:
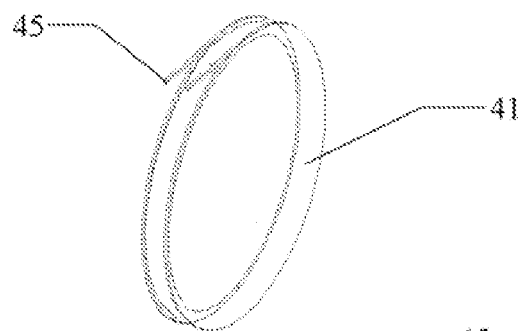
FIGS. 10A-10E illustrate aspects of the invention with respect to the magnet, bobbin, coolant tubing, and bobbin bridge.
Figure 10B:
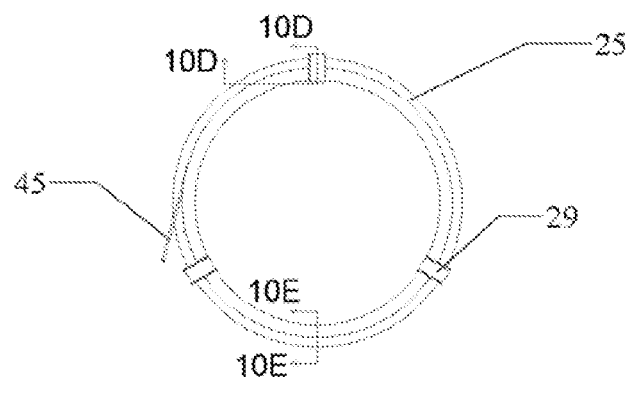
Figure 10C:
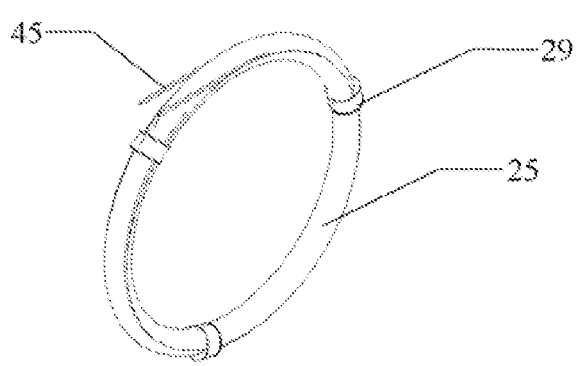
Figure 10D:
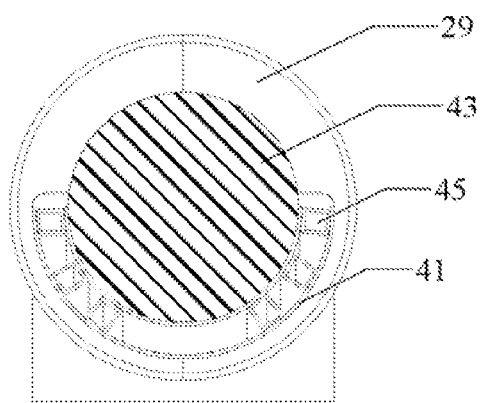
Figure 10E:
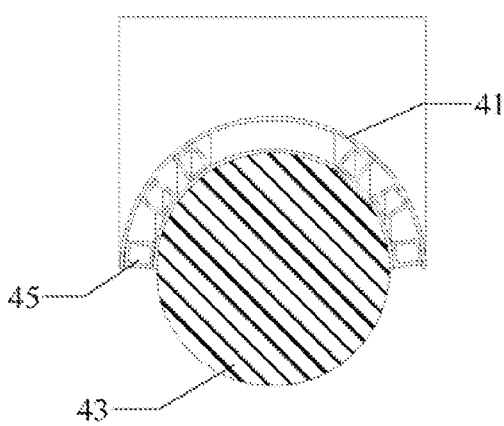

FIGS. 10A to 10E illustrate orientation of superconducting magnet 43 to bobbin 41 (magnet/bobbin subassembly 25). FIG. 10B presents a side view of magnet/bobbin subassembly 25 and a plurality (three shown) of bobbin bridges 29 (FIG. 11B). FIG. 10A illustrates an embodiment wherein coolant tubing 45 is attached to bobbin 41. FIG. 10C presents a perspective view of magnet/bobbin subassembly 25, bobbin bridges 29 and coolant tubing 45. FIG. 10D presents a cross-section view of magnet/bobbin subassembly 25 taken at the location of a bobbin bridge 29. FIG. 10E presents a cross-section view of magnet/bobbin subassembly 25 taken at a location away from bobbin bridges 29. FIGS. 10A to 10E illustrate the relationship of the bobbin 41 and magnet 43 to the bobbin bridges 29 for an embodiment encompassing coolant tubing and a round cross-section magnet. It should be understood that the present invention encompasses other embodiments as well, with respect to other magnet cross-section shapes, coolant channels, and magnet/bobbin orientations as illustrated in FIGS. 15A to 15F and other support techniques as illustrated in FIGS. 8A to 8C that may or may not require a bobbin bridge 29.

Figure 11A:
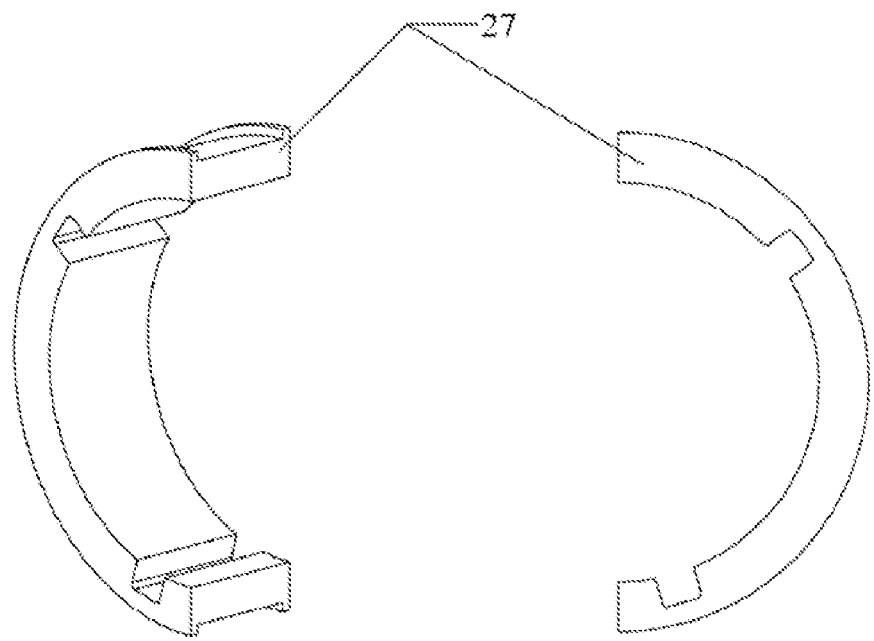
FIG. 11A illustrates aspects of the invention with respect to the thermal shield bridge.
Figure 11B:
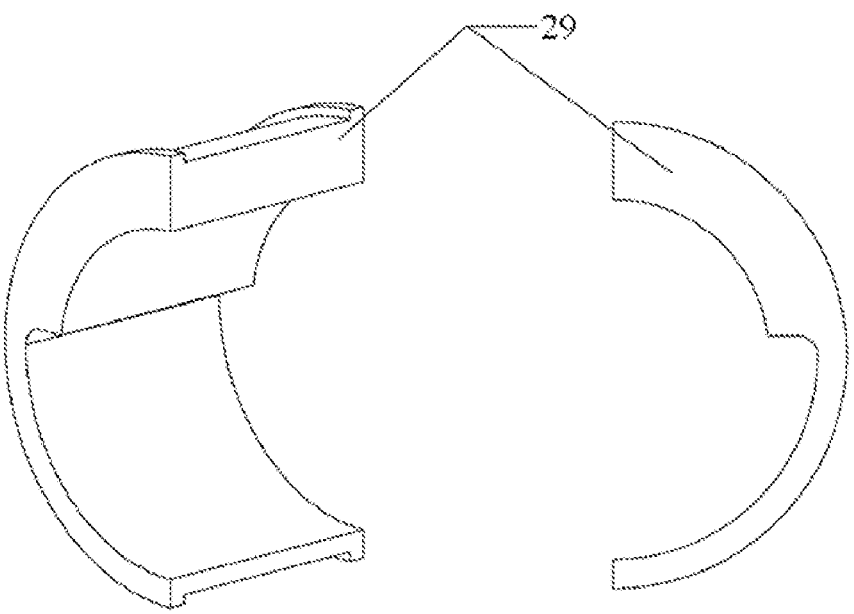
FIG. 11B illustrates aspects of the invention with respect to the bobbin bridge.

FIG. 11A illustrates a thermal shield bridge 27 embodiment comprising half-shell pieces that conform as needed to coolant tubing geometry. FIG. 11B illustrates a bobbin bridge 29 embodiment comprising half-shell pieces that conform as needed to the magnet and bobbin. It should be understood that the invention includes other bridge embodiments wherein the sections conform as needed for other coolant geometries.

Figure 12A:
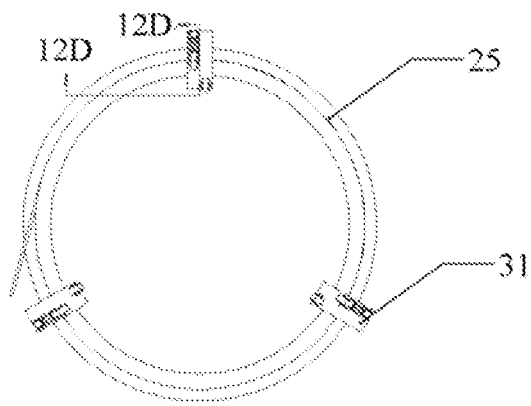
FIGS. 12A-12D illustrate aspects of the invention with respect to the inner support assemblies, magnet/bobbin subassembly, thermal shield, and bobbin bridge.
Figure 12B:
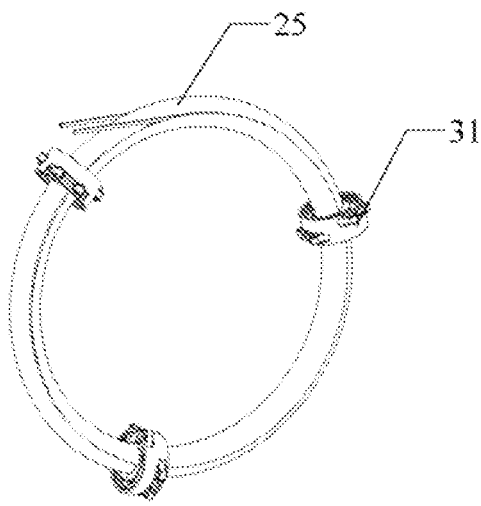
Figure 12C:
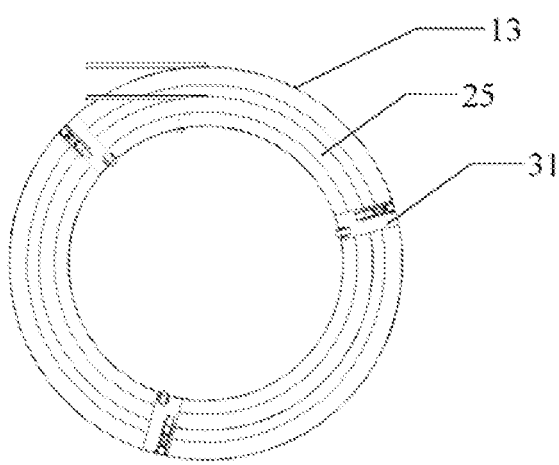
Figure 12D:
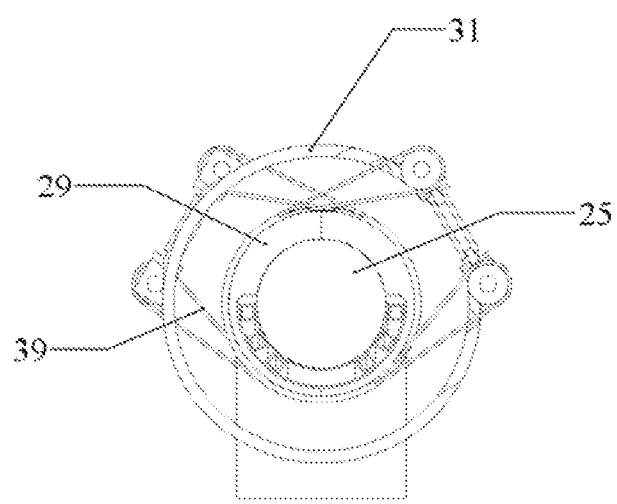

FIGS. 12A to 12D further illustrate orientation of the plurality (three shown) of inner support assemblies 31 (utilizing straps 39) with respect to magnet/bobbin subassembly 25. FIGS. 12A and 12B present side and perspective views, respectively, of magnet/bobbin subassembly 25, and a plurality of inner support assemblies 31 (three shown). FIG. 12C presents a side view of magnet/bobbin subassembly 25, inner support assemblies 31 and thermal shield 13. Inner support assemblies 31 may be secured to thermal shield 13 by means well known to those skilled in the art, including but not limited to, welding and mechanical fastening. FIG. 12D presents a cross-section view taken at the location of an inner support assembly 31. Bobbin bridge 29 is disposed between inner support assembly 31 and magnet/bobbin subassembly 25 to provide thermal isolation. Straps 39 (two shown) are concentric with magnet/bobbin subassembly 25. In a preferred embodiment, the straps keep the magnet 43, bobbin 41 and bobbin bridge 29 concentric with thermal shield 13 with respect to hoop cross-section (FIG. 8A) and with respect to the major bore axis of the thermal shield 13 (FIG. 18B). In another embodiment, the straps 39 and/or bobbin bridge 29 hold the magnet 43, bobbin 41 and bobbin bridge 29 off-centric with thermal shield 13 with respect to hoop cross-section (FIG. 18C) and concentric with respect to the major bore axis of the thermal shield 13 (FIG. 18B).

Figure 13A:
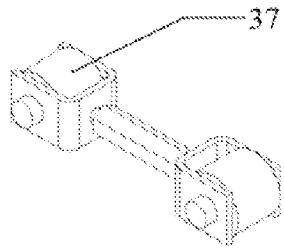
FIGS. 13A-13F illustrate aspects of the invention with respect to components comprising an inner support assembly (ISA).
Figure 13B:
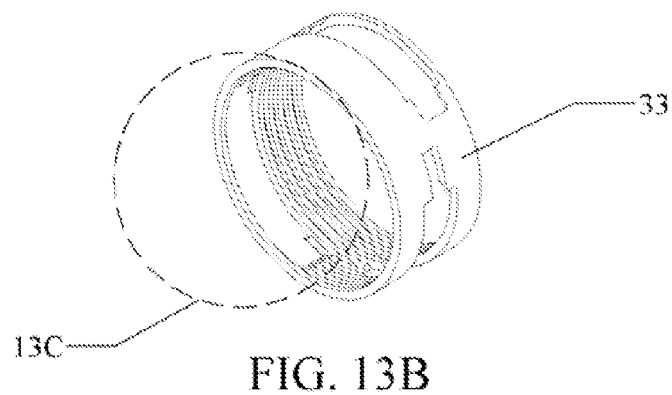
Figure 13C:
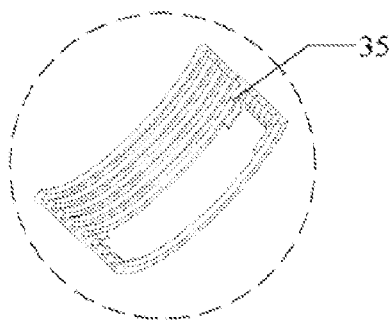
Figure 13D:
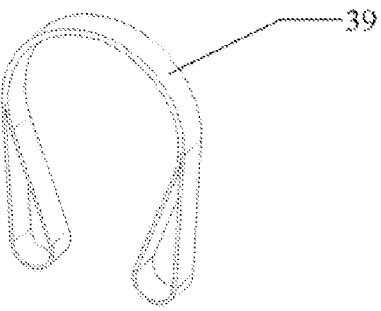
Figure 13E:
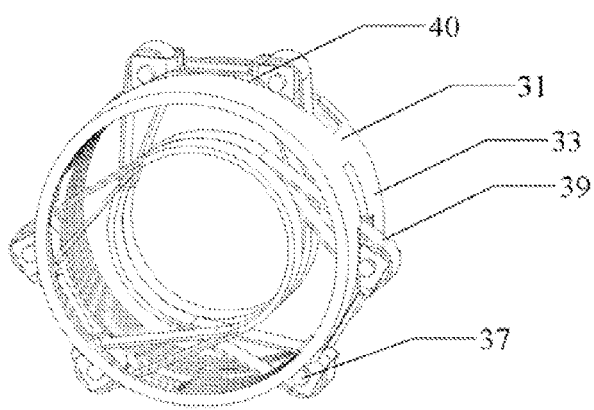
Figure 13F:
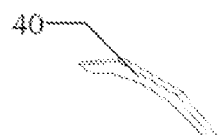

FIGS. 13A to 13F illustrate components of an embodiment of inner support assembly 31 utilizing strap restraint members. Referring to FIG. 13E, a plurality (at least three) of straps 39 (FIG. 13D) are spaced generally equally around the circumference of the support ring 33. The two ends of each strap 39 are anchored to support ring 33 (FIG. 13B) by tension assembly 37 (FIG. 13A) at support ring section 35 (FIG. 13C) via tension assembly ramps 40 (FIG. 13F). In preferred embodiments, tension assembly ramps 40 would be an integral part of support ring 33. Preferred materials for support ring 33, tension assembly 37, and tension assembly ramps 40, would be those having lightweight, high thermal conductivity and relative permeability of 1 (to preclude interference with the magnetic field). Aluminum would be preferred over copper where weight is an issue, and preferred over titanium if cost is an issue.

Figure 14A:
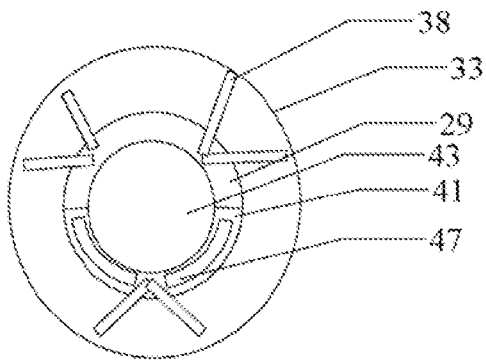
FIGS. 14A-14D illustrate embodiments of the invention wherein rods/links, or beam restraint members anchor/support the magnet/bobbin subassembly within the thermal shield.
Figure 14B:
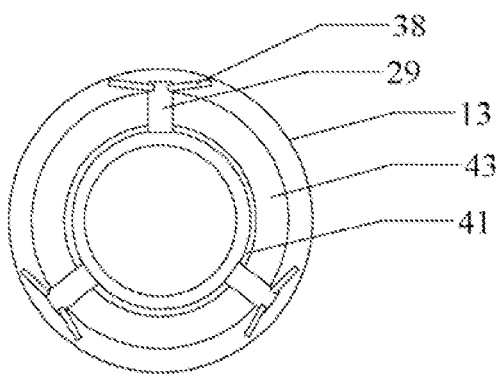
Figure 14C:
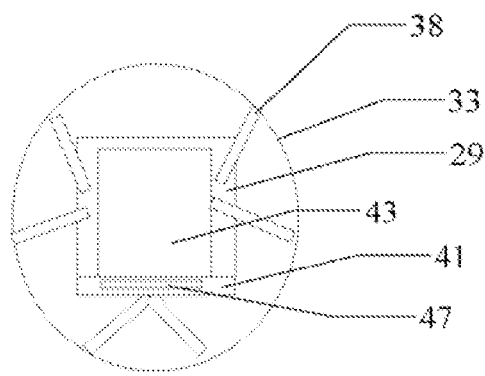
Figure 14D:
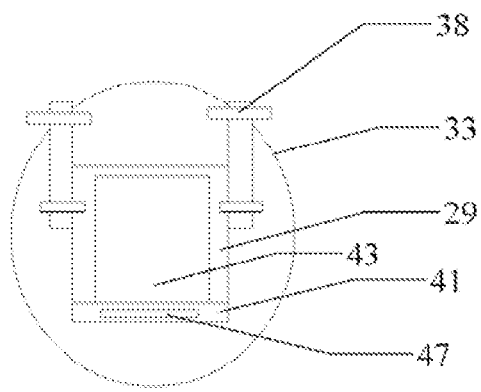

FIGS. 14A, 14B, 14C, and 14D illustrate embodiments wherein rods/links (FIGS. 14A, 14B, and 14C) or beams (FIG. 14D) are used to anchor/support magnet 43 and bobbin 41 to thermal shield 13. FIG. 14A (end view) illustrates a plurality of rods/links (restraint members 38) emanating radially, that anchor/support circular cross-section magnet 43 and bobbin 41 to support ring 33 via attachment to bobbin bridge 29. FIG. 14B (side view) illustrates the plurality of rods/links (restraint members 38) emanating azimuthally, anchoring/supporting magnet 43 and bobbin 43 to thermal shield 13 via attachment to bobbin bridge 29. FIG. 14C (end view) illustrates a plurality of rods/links (restraint members 38) emanating radially, that anchor/support square cross-section magnet 43 and bobbin 41 to support ring 33 via attachment to bobbin bridge 29. FIG. 14D (end view) illustrates a plurality of beams (restraint members 38) emanating radially, that anchor/support square cross-section magnet 43 and bobbin 41 to support ring 33 via attachment to bobbin bridge 29. It should be understood that the beam restraint members 38 emanate azimuthally (not shown), analogous to the beam restraint members shown in FIG. 14B. In embodiments where thermal shield 13 is present, support ring 33 is attached to thermal shield 13. In embodiments where thermal shield 13 is absent, support ring 33 would be attached directly to vacuum vessel 9. In the embodiments shown, bobbin 41 and magnet 43 are cooled by coolant flowing in coolant channel 47.

Figure 15A:
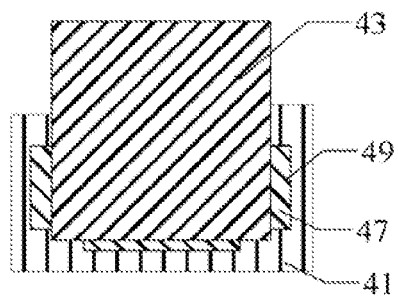
FIGS. 15A-15F illustrate aspects of the invention with respect to various embodiments for bobbin coolant paths.
Figure 15B:
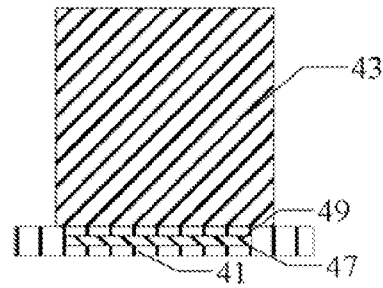
Figure 15C:
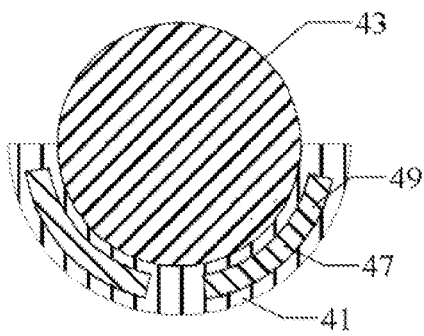
Figure 15D:
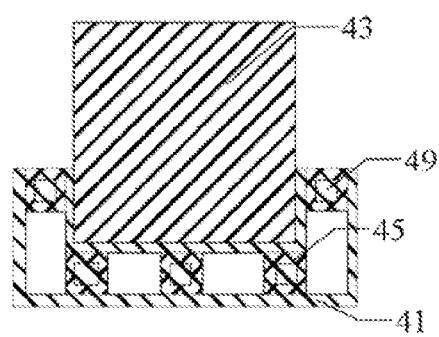
Figure 15E:
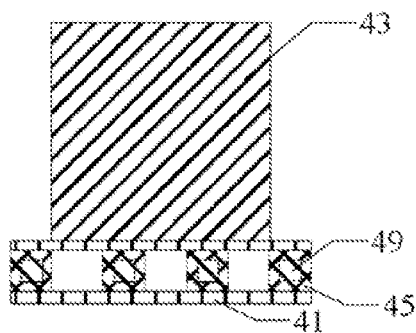
Figure 15F:
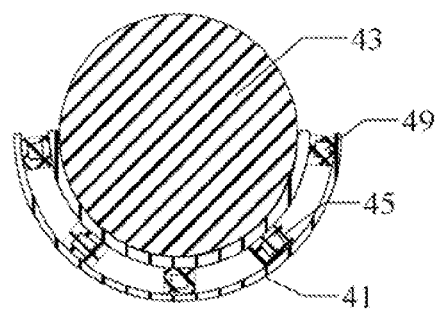

FIGS. 15A to 15F present cross-section views that illustrate various embodiments for supplying coolant 49 to bobbin 41 and magnet 43 cross-sections. FIG. 15A illustrates an embodiment wherein square cross-section magnet 43 is cradled in square shaped bobbin 41, and coolant 49 flows in coolant channel(s) 47. FIG. 15B illustrates an embodiment wherein square cross-section magnet 43 is disposed on flat bobbin 41, and coolant 49 flows in coolant channel 47. FIG. 15C illustrates an embodiment wherein round cross-section magnet 43 is cradled in round shaped bobbin 41, and coolant 49 flows in coolant channel(s) 47. FIG. 15D illustrates an embodiment wherein square cross-section magnet 43 is cradled in square shaped bobbin 41, and coolant 49 flows in coolant tubes 45. FIG. 15E illustrates an embodiment wherein square cross-section magnet 43 is disposed on flat bobbin 41, and coolant 49 flows in coolant tubes 45. FIG. 15F illustrates an embodiment wherein round cross-section magnet 43 is cradled in round shaped bobbin 41, and coolant 49 flows in coolant tubes 45. It should be understood that rectangular cross-sections and shapes for the magnet and bobbin could be used instead of square cross-sections. In preferred embodiments, the tubing is square or rectangular in cross-section to maximize thermal contact with the bobbin surfaces. Other shapes such as circular, elliptical, or other polygons may be useful as a particular situation dictates. Preferred materials for the bobbin and tubing would be those with high thermal conductivity, such as copper or aluminum. Attachment methods include brazing (for copper), welding (for aluminum), and mechanical fastening using indium as a gasket material. It is also understood that the cross-sections represent situations in which the bobbin 41 is on the inner as well as outer diameter of the magnet 43 coil. In cases where they represent the outer diameter of the magnet 43, then the magnet 43 is wound separately on a different bobbin and then applied to the final assembly bobbin 41.

Figure 16:
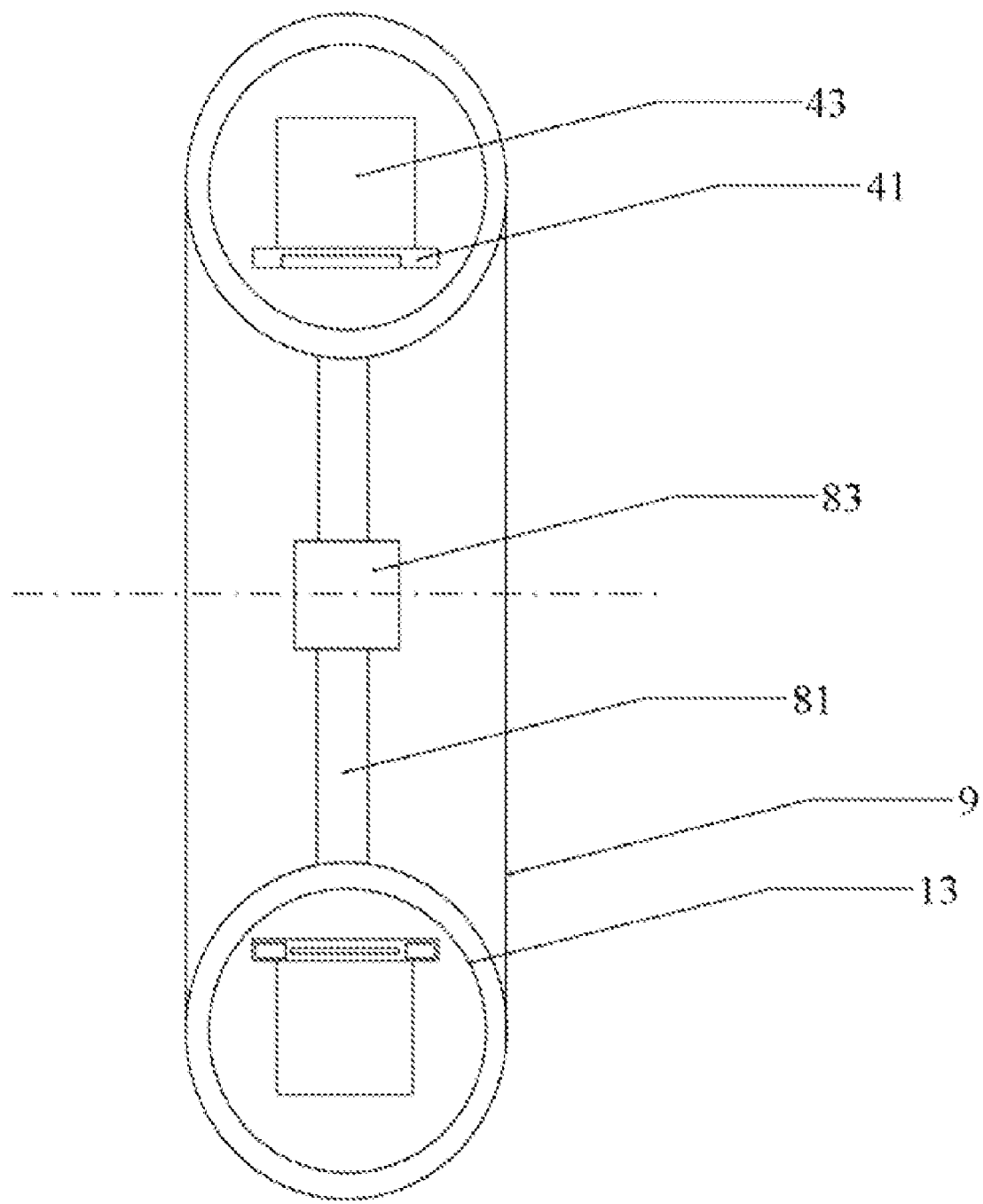
FIG. 16 illustrates an embodiment of the invention having ferromagnetic material in the center bore for shielding or focusing of the magnetic field.

FIG. 16 presents an end view illustrating an embodiment of the invention having ferromagnetic core 83 in the center bore enabling shielding or focusing of the magnetic field. Ferromagnetic core 83 is held in place by radial supports (spokes) 81, secured to toroidal shaped vacuum vessel 9. Magnet 43, bobbin 41 thermal shield 13, and vacuum vessel 9 are all as described previously. Ferromagnetic core 83 allows focusing of the magnetic field closer to the center line axis of the magnet, possibly allowing less magnet material or smaller diameter. Less magnet material would reduce cost, and smaller diameter would increase portability. A tradeoff would need to be made as to weight of the ferromagnetic core 83 vs. weight savings from the magnet or as the situation dictates.

Figure 17A:
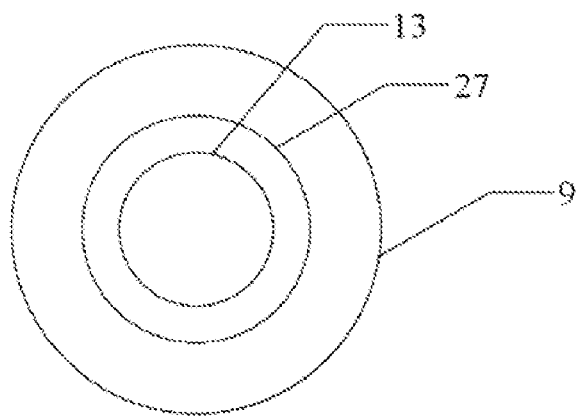
FIGS. 17A-17C illustrate embodiments for concentricity and off-centricity of the thermal shield and thermal shield bridge with the vacuum vessel with respect to hoop cross-section and the major bore axis of the vacuum vessel.
Figure 17B:
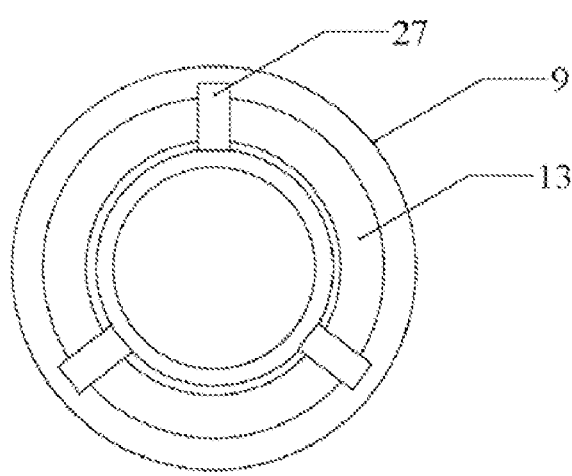
Figure 17C:
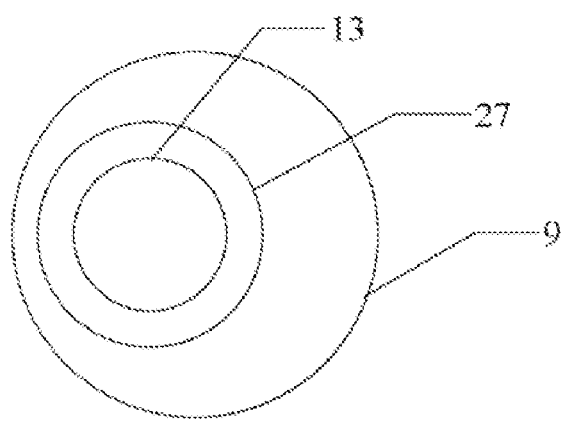

FIGS. 17A and 17B illustrate an embodiment for concentricity of the thermal shield 13 and thermal shield bridge 27 with vacuum vessel 9 with respect to hoop cross-section (FIG. 17A) and the major bore axis (FIG. 17B) of vacuum vessel 9. FIGS. 17C and 17B illustrate an embodiment for off-centricity of the thermal shield 13 and thermal shield bridge 27 with vacuum vessel 9 with respect to hoop cross-section (FIG. 17C) and concentricity of these same components with respect to the major bore axis (FIG. 17B) of vacuum vessel 9.

Figure 18A:
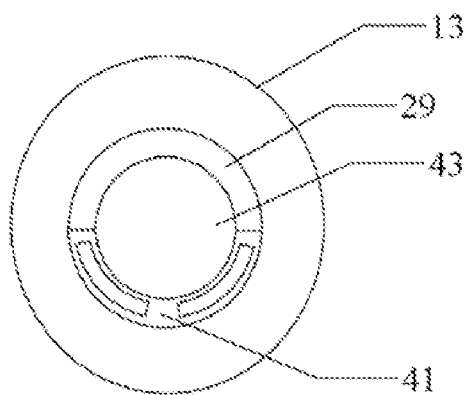
FIGS. 18A-18C illustrate embodiments for concentricity and off-centricity of the magnet, bobbin and bobbin bridge with the thermal shield with respect to hoop cross-section, and concentricity of these same components with respect to the major bore axis of the thermal shield.
Figure 18B:
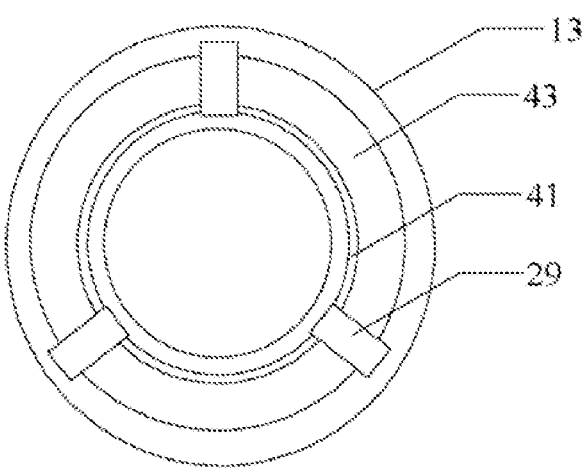
Figure 18C:
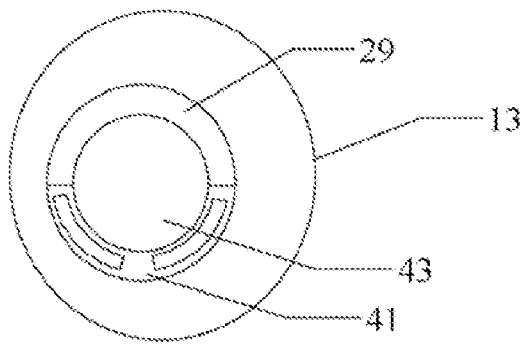

FIGS. 18A and B illustrate an embodiment for concentricity of the magnet 43, bobbin 41 and bobbin bridge 29 with the thermal shield 13 with respect to hoop cross-section (FIG. 18A), and concentricity of these same components with respect to the major bore axis (FIG. 18B) of the thermal shield 13. FIGS. 18C and 18B illustrate an embodiment for off-centricity of the magnet 43, bobbin 41 and bobbin bridge 29 with the thermal shield 13 with respect to hoop cross-section (FIG. 18C), and concentricity of these same components with respect to the major bore axis (FIG. 18B) of the thermal shield 13.

Figure 19A:
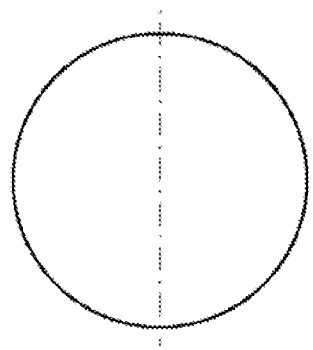
FIGS. 19A-19E illustrate various embodiments for circular and non-circular hoop cross-section shapes for the vacuum vessel and/or thermal shield.
Figure 19B:
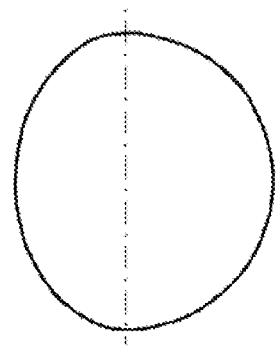
Figure 19C:
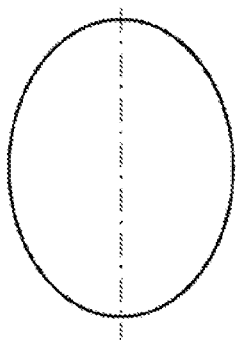
Figure 19D:
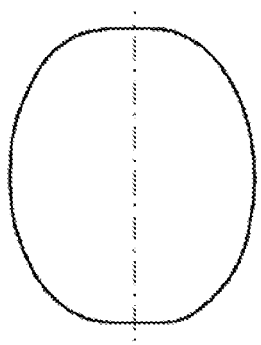
Figure 19E:
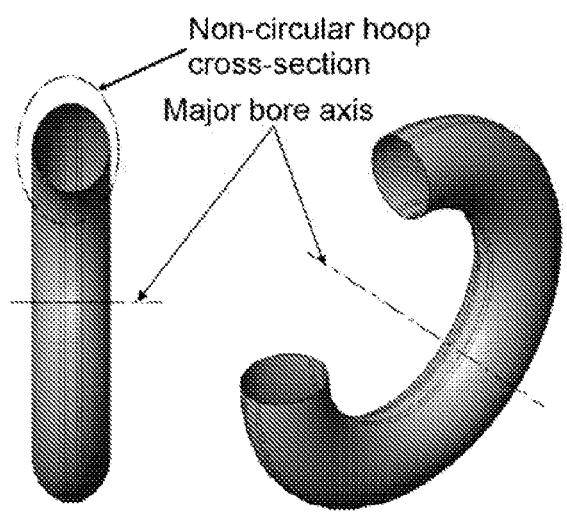

FIGS. 19A to 19D illustrate embodiments for circular and non-circular hoop cross-section shapes for vacuum vessel 9 and/or thermal shield 13. FIG. 19A illustrates a circular cross-section shape. FIG. 19B illustrates a cross-section shape having a portion that is dished and another portion that is circular. FIG. 19C illustrates a dished cross-section shape. FIG. 19D illustrates a dished cross-section shape with portions that are flat. The hoop cross-section shape (FIG. 19E) can affect the distance from the center plane of the magnet to the face of the vacuum vessel (FIG. 19E). A non-circular hoop cross-section vacuum vessel and/or thermal shield as shown in FIG. 19E reduces the distance from the center plane of the magnet to the face of the vacuum vessel thereby increasing the projection of the usable magnetic field. This would allow less magnet material and hence a lighter magnet for the same projected field as compared to a circular hoop cross-section.

Obviously numerous modifications and variations of the present invention are possible in the light of the above teachings. It is therefore to be understood that within the scope of the appended claims the invention may be practiced otherwise than as specifically described therein.

I claim:

1. A superconducting magnet apparatus comprising:
a toroidal shaped superconducting magnet;
a bobbin in thermal contact with said magnet and upon which said magnet disposed, said bobbin and said magnet together comprising a magnet/bobbin subassembly;
a toroidal shaped vacuum vessel in which said magnet/bobbin subassembly is disposed; one or more coolants, wherein said coolants are primarily selected based on their thermodynamic and transport properties providing the capability to remove adequate thermal energy in order to maintain said magnet in the superconducting state;
one or more transport lines enabling delivery of said coolant to and from said vacuum vessel; at least three inner support assemblies (ISA) distributed circumferentially around said magnet/bobbin subassembly to anchor and support said magnet/bobbin subassembly within said vacuum vessel;

each said ISA comprising a support ring and a plurality of restraint members, with said restraint members connecting said magnet/bobbin subassembly to said support ring, and said restraint members being selected from the group consisting of straps, rods/links, beams, and any combination of the foregoing;

and one or more coolant flow paths within said vacuum vessel that brings said coolant into thermal contact with said bobbin to remove thermal energy from said magnet by a combination of conducting and convection; wherein the superconducting magnet apparatus further comprises: a toroidal shaped thermal shield within which said magnet/bobbin subassembly is disposed, wherein said inner support assemblies anchor and support said magnet/bobbin subassembly concentrically or off-centrically within said thermal shield, said ISA support rings being structurally attached to said thermal shield; and at least three outer support assemblies (OSA) distributed circumferentially around said thermal shield to anchor and support said thermal shield within said vacuum vessel, with each said OSA comprising a support ring and a plurality of restraint members, with said OSA restraint members connecting said thermal shield to said OSA support ring, said OSA support rings being structurally attached to said vacuum vessel, and wherein OSA restraint members are selected from the group consisting of straps, rods/links, beams, and any combination of the foregoing.

2. The superconducting magnet apparatus of claim 1 wherein:
said support rings are structurally attached to said vacuum vessel.

3. The superconducting magnet apparatus of claim 1 wherein:
said bobbin coolant flow paths are selected from the group consisting of tubes in thermal contact with said bobbin, channels in said bobbin, and any combination of the foregoing.

4. The superconducting magnet apparatus of claim 1 further comprising:
one or more coolant flow paths within said vacuum vessel that brings said coolant into thermal contact with said thermal shield to remove thermal energy from said thermal shield.

5. The superconducting magnet apparatus of claim 4 wherein:
said thermal shield coolant paths comprises one or more paths that receives coolant exiting from said bobbin coolant path whereby said coolant removes thermal energy from said thermal shield prior to exiting from said vacuum vessel.

6. The superconducting magnet apparatus of claim 4 wherein:
said thermal shield coolant paths are selected from the group consisting of tubes in thermal contact with said thermal shield, channels in said thermal shield, and any combination of the foregoing.

7. The superconducting magnet apparatus of claim 1 further comprising:
one or more coolant flow paths within said vacuum vessel that brings said coolant into thermal contact with the electrical leads of said magnet.

8. The superconducting magnet apparatus of claim 4 wherein:
said coolants comprise coolant one and coolant two, with coolant one traversing said bobbin coolant path, and coolant two traversing said thermal shield coolant path.

9. The superconducting magnet apparatus of claim 1 further comprising:
a bobbin bridge interposed between said magnet/bobbin subassembly and each ISA.

10. The superconducting magnet apparatus of claim 9 wherein: said ISA restraint members are straps, and each said ISA further comprises tension assembly ramps integral with said ISA support ring and tension assemblies, with said straps being wrapped concentrically around said bobbin bridge, and the ends of said straps being attached to said ISA support ring by said tension assemblies and tension assembly ramps.

11. The superconducting magnet apparatus of claim 1 further comprising:
a thermal shield bridge interposed between said thermal shield and each OSA.

12. The superconducting magnet apparatus of claim 11 wherein:
said OSA restraint members are straps, with said straps being wrapped concentrically around said thermal shield bridge, and the ends of said straps being attached to said OSA support ring.

13. The superconducting magnet apparatus of claim 1 wherein:
said ISA restraint members are selected from the group consisting of rods/links and beams; and wherein said ISA restraint members emanate radially and azimuthally.

14. The superconducting magnet apparatus of claim 1 wherein:
said OSA restraint members are selected from the group consisting of rods/links and beams; and wherein said OSA restraint members emanate radially and azimuthally.

15. The superconducting apparatus of claim 1 further comprising:
a ferromagnetic core disposed in the center bore of said vacuum vessel; and a plurality of radial supports which secure said ferromagnetic core to said vacuum vessel.

16. A superconducting magnet apparatus comprising:
a toroidal shaped superconducting magnet;
a bobbin in thermal contact with said magnet and upon which said magnet is disposed, said bobbin and said magnet together comprising a magnet/bobbin subassembly,
a toroidal shaped vacuum vessel in which said magnet/bobbin subassembly is disposed; one or more coolants, wherein said coolants are primarily selected based on their thermodynamic and transport properties providing the capability to remove adequate thermal energy in order to maintain said magnet in the superconducting state;
one or more transport lines enabling delivery of said one or more coolants to and from said vacuum vessel;
a toroidal shaped thermal shield within which said magnet/bobbin subassembly is disposed; at least three inner support assemblies (ISA) distributed circumferentially around said magnet/bobbin subassembly to anchor and support said magnet/bobbin subassembly within said thermal shield;
a bobbin bridge interposed between said thermal shield and each said ISA;
each said ISA comprising a support ring and a plurality of restraint members, said ISA support rings being structurally attached to said thermal vessel, with said restraint members connecting said bobbin bridge to said support ring, and said restraint members being selected from the group consisting of straps, rods/links, beams and any combination of the foregoing; one or more coolant flow paths within said vacuum vessel that brings said one or more coolants into thermal contact with said bobbin to remove thermal energy from said magnet by thermal conduction, and into thermal contact with said thermal shield to remove thermal energy from said thermal shield, wherein said bobbin and thermal shield coolant flow paths are selected from the group consisting of tubes in thermal contact with said bobbin, channels in said bobbin, and any combination of the foregoing;

at least three outer support assemblies (OSA) distributed circumferentially around said thermal shield to anchor and support said thermal shield within said vacuum vessel; a thermal shield bridge interposed between said thermal shield and each said OSA; each said OSA comprising a support ring and a plurality of restraint members, said OSA support rings being structurally attached to said vacuum vessel, with said OSA restraint members connecting said thermal shield bridge to said OSA support ring, and wherein OSA restraint members are selected from the group consisting of straps, rods/links, beams and any combination of the foregoing.

17. The superconducting magnet apparatus of claim 16 wherein:
said OSA restraint members are straps, with said straps being wrapped concentrically around said thermal shield bridge, and the ends of said strap being attached to said OSA support ring;
said ISA restraint members are straps, and each said ISA further comprises tension assembly ramps integral with said ISA support ring and tension assemblies, with said straps being wrapped concentrically around said bobbin bridge, and the ends of said straps being attached to said ISA support ring by said tension assemblies and tension assembly ramps.

18. The superconducting magnet apparatus of claim 16 wherein:
said coolants comprise coolant one and coolant two, with coolant one traversing said bobbin coolant path, and coolant two traversing said thermal shield coolant path.

19. The superconducting magnet apparatus of claim 16 wherein:
said coolant traverses said bobbin coolant path first, then traverses said thermal shield coolant path.

* * * * *